United States Patent [19]

Schmidt

[11] Patent Number: 6,157,568
[45] Date of Patent: Dec. 5, 2000

[54] AVALANCHE PROGRAMMED FLOATING GATE MEMORY CELL STRUCTURE WITH PROGRAM ELEMENT IN FIRST POLYSILICON LAYER

[75] Inventor: Christopher O. Schmidt, Sunnyvale, Calif.

[73] Assignee: Vantis Corporation, Sunnyvale, Calif.

[21] Appl. No.: 09/220,469

[22] Filed: Dec. 23, 1998

[51] Int. Cl.$^7$ .................................................. G11C 11/34
[52] U.S. Cl. .................................. 365/185.1; 365/185.01
[58] Field of Search ............................ 365/185.1, 185.01

[56] References Cited

U.S. PATENT DOCUMENTS

| | | | |
|---|---|---|---|
| 4,458,348 | 7/1984 | Fukuda et al. | 365/185 |
| 4,924,278 | 5/1990 | Logie | 357/23.5 |
| 5,491,657 | 2/1996 | Haddad et al. | 365/185.27 |
| 5,554,552 | 9/1996 | Chi | 437/43 |
| 5,640,346 | 6/1997 | Preslar | 365/185.1 |
| 5,719,427 | 2/1998 | Tong et al. | 257/355 |
| 5,742,542 | 4/1998 | Lin et al. | 365/185.08 |

OTHER PUBLICATIONS

"Performance Limitations of a Flash E$^2$PROM Cell, Programmed with Zener Induced Hot Electrons", by J. Ranaweera, I. Kalastirsky, A. Dibu–Caiole, W.T. Ng, and C.A.T. Salama, Proceedings, of the 15th Annual Non–Volatile Semiconductor Memory Workshop, Paper #2.2 (1997).

Primary Examiner—David Nelms
Assistant Examiner—M. Tran
Attorney, Agent, or Firm—Fliesler, Dubb, Meyer & Lovejoy LLP

[57] ABSTRACT

A non-volatile memory cell structure which includes a floating gate, at least one injection element and a sense transistor. The injection element is at least partially formed in a first polysilicon layer. The floating gate is provided in a second polysilicon layer and capacitively coupled to the reverse breakdown element. The sense transistor is at least partially formed in a region of a semiconductor substrate, and connected to the floating gate. The structure may further comprise a control gate capacitively coupled to the floating gate and may be formed in said first polysilicon layer.

29 Claims, 6 Drawing Sheets

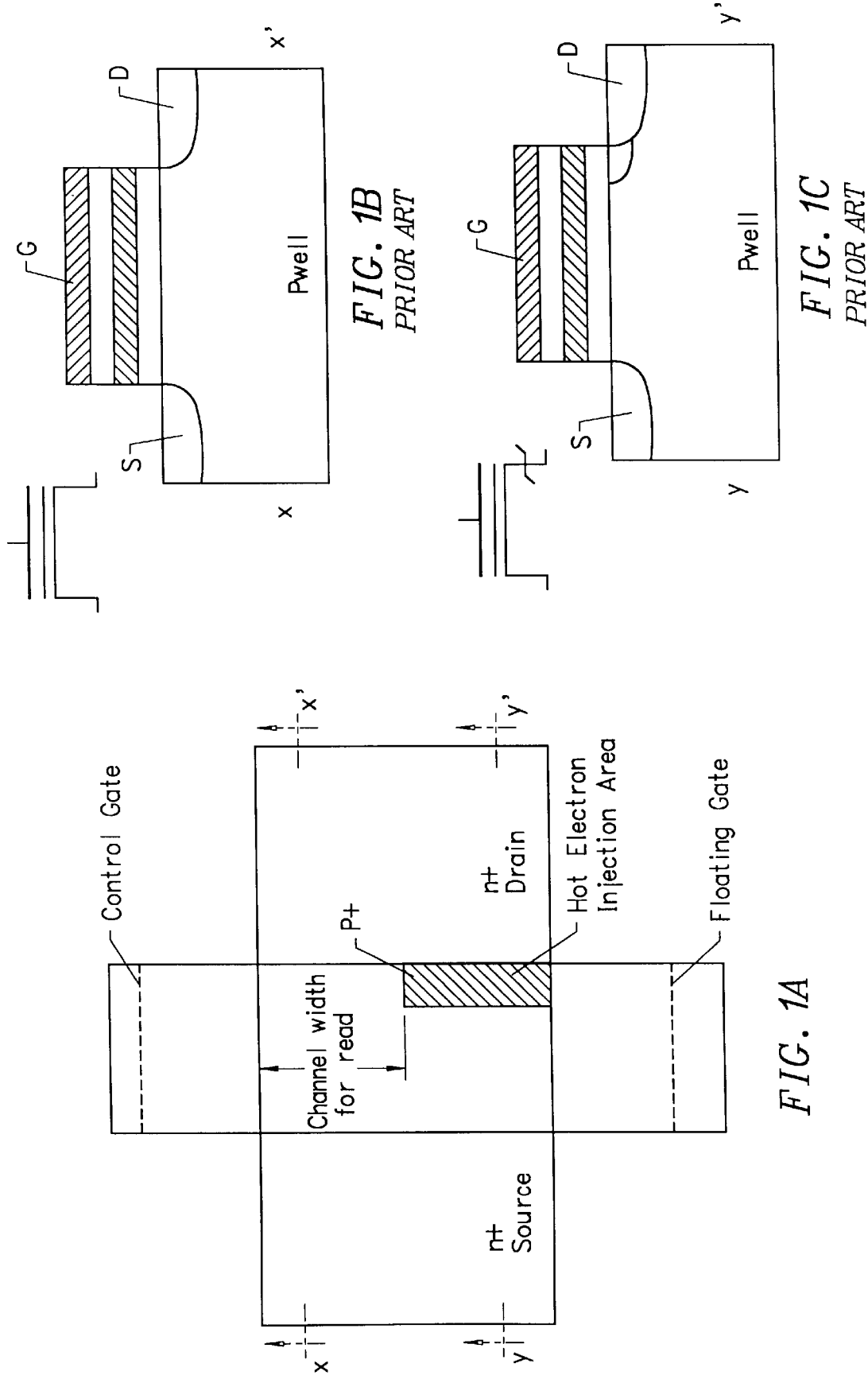

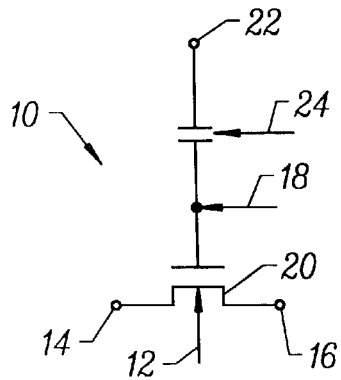
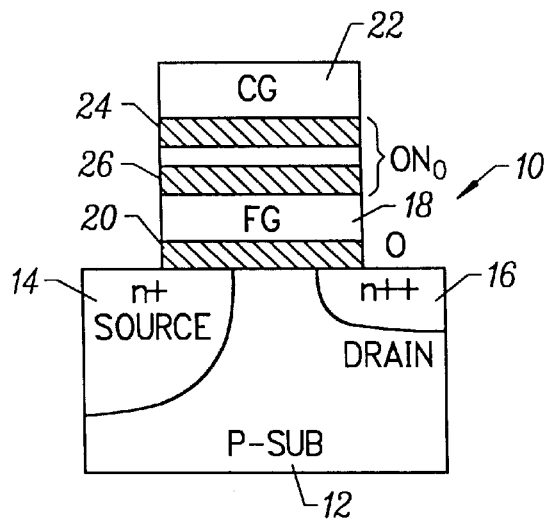
FIG. 2A
*PRIOR ART*
FIG. 2B
*PRIOR ART*
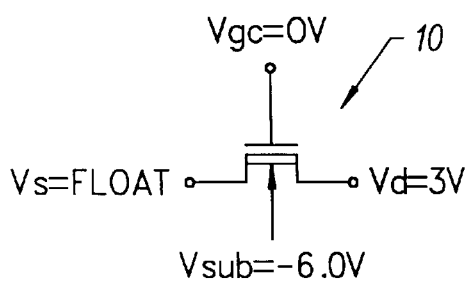
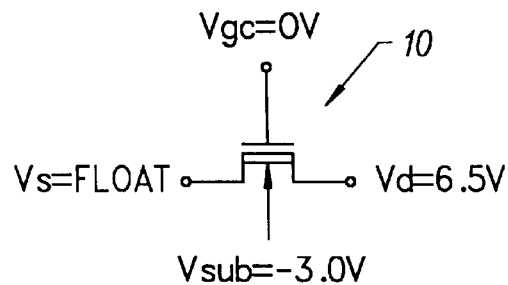
FIG. 3A
*PRIOR ART*
FIG. 3B
*PRIOR ART*

| Operation | ACG | BL | WL | WC | FG |
|---|---|---|---|---|---|
| Erase (bulk) | 0V | 8V | 0V | HiZ | -ve |
| Program | 8V | 8V | 0V | HiZ | -ve+$\Delta V_p$ |
| Not progr. | 0V | 8V | 0V | HiZ | -ve-$\Delta_p$ |
| Not progr. | 8V | 3.3V | 0V | HiZ | -ve |
| Read | 3.3V | ground | 3.3V | 3.3V | -ve(or+$\Delta V_p$) |

$\Delta_p$ = Programming disturb; it should be less than 1V.

$\Delta V_p$ = It will be in 3-8V range depending on programming time. $\Delta V_p \cong 4V$ for $t_{prog} \cong 10 \mu s$.

*Assumed that the junction breakdown voltage is at 7.5V or below so that 8V operation is sufficient for junction breakdown.

FIG. 4B
*PRIOR ART*

AVALANCHE PROGRAMMED FLOATING GATE MEMORY CELL STRUCTURE WITH PROGRAM ELEMENT IN FIRST POLYSILICON LAYER

BACKGROUND OF THE INVENTION

1. Field of the Invention

The invention relates to nonvolatile memory, and particularly a non-volatile memory structure in which a write device is formed in a polysilicon layer over a substrate surface and optimized for particular applications such as programmable logic devices.

2. Description of the Related Art

Non-volatile memory devices of the type commonly referred to in the art as EPROM, EEPROM, or Flash EEPROM serve a variety of purposes, and are hence provided in a variety of architectures and circuit structures. One such application is termed a "programmable logic device" or PLD. The PLD includes a programmable array of non-volatile memory devices which can be customized by end users for particular applications.

As with many types of integrated circuit devices, some of the main objectives of non-volatile memory device designers are to increase the performance of devices, while decreasing device dimensions and consequently increasing circuit density. Cell designers strive for designs which are reliable, scalable, cost effective to manufacture and able to operate at lower power, in order for manufacturers to compete in the semiconductor industry. EEPROM devices are one such device that must meet these challenges. In some applications, such as flash memory cards, density is at a premium, while in applications such as programmable logic devices (PLD's), speed is more important and space is at less of a premium.

EEPROMS (electrically erasable/programmable read-only memories) generally employ Fowler-Nordheim (F-N) tunneling for both programming and erasing. The term "flash", when used with "EEPROM", generally refers to a device programmed by hot electron injection. Typically, flash technology employs a floating gate structure with a thin oxide layer between the floating gate and the drain side of the transistor where Fowler-Nordheim tunneling occurs.

As process technology moves toward the so-called 0.18 and 0.13 micron processes, the conventional "stacked gate" EEPROM structure has given way to different cell designs and array architectures, all intended to increase density and reliability in the resulting circuit. In addition, designers are driven to reduce the power requirements of such devices as a result of such scaling. In non-volatile memory devices, the program and erase functions generally require the largest voltages and consequently reducing program voltages achieves overall device power savings.

An alternative to the aforementioned FN tunneling-based EEPROM cell structure is presented in Ranaweera, et al., "Performance Limitations of a Flash EEPROM Cell, Programmed With Zener Induced Hot Electrons," University of Toronto Department of Electrical Engineering (1997). Discussed therein is a flash EEPROM cell which accomplishes programming by establishing a reverse breakdown condition at the drain/substrate junction, generating hot electrons which are then swept onto to the floating gate to program the cell.

FIGS. 1A, 1B and 1C of Ranaweera, et al. are reproduced as FIGS. 1A, 1B and 1C of the present application. FIGS. 1B and 1C show cross-sections of the cell shown in FIG. 1A. As shown in FIG. 1C, a "ZEEPROM" cell comprises a source and drain region, floating gate and control gate, with a P+ pocket implant extending part way across the width of the drain region to generate hot electrons for programming. The flash ZEEPROM cells are fabricated using CMOS compatible process technology, with the addition of a heavily doped boron implant for the P+ region replacing the LDD region. A sidewall spacer is necessary to form the self-aligned N+ source and drain regions and to avoid counter-doping of the P+ pocket.

To program the flash ZEEPROM cell, the P+N+ junction is reverse-biased to create an electric field of approximately $10^6$ volt/cm. and generate energetic hot electrons independent of the channel length. The P+ region adjacent to the drain enhances this generation. A low junction breakdown current can be used for programming by optimizing the P+N+ junction depth and controlling the applied drain voltage. One disadvantage of this cell is that a low drain voltage (approximately one volt) must be used to read the cell since the P+ region exhibits a low breakdown voltage which can contribute to "soft programming." Another disadvantage is that the cell provides lower read current compared with conventional flash memory cells since the P+N+ heavy doping required for breakdown reduction allows for very little channel conduction in that portion of the channel. Further, the P+N+ doping increases cell capacitance in the read path and increases switching delays. Erasing in the cell is performed by Fowler-Nordheim tunneling of electrons from the floating gate to the source region using a negative gate voltage and a positive supply voltage connected to the source similar to conventional flash EEPROM cells.

Another alternative cell structure using hot election programming generated by a reverse breakdown condition at the drain is described in the context of a method for bulk charging and discharging of an array of flash EEPROM memory cells in U.S. Pat. No. 5,491,657 issued to Haddad, et al., assigned to the assignee of the present invention. In Haddad, et al., a cell structure similar to that shown in cross-section in FIG. 1 B of the present application may be used, as well as a substrate-biased p-well in n-well embodiment. In the first embodiment, an N+ source region includes an N+ implant region and an N diffusion region, and the erase operation (removing electrons) is accomplished by applying (−)8.5 volts to the control gate for 100 milliseconds, and (+)5 volts to the source for 100 milliseconds, with the drain being allowed to float. In contrast, programming (adding electrons to the gate) is achieved by applying a negative 8.5 volt to the substrate for 5 microseconds, zero volts to the drain and control gate with the source floating. The bulk charging operation can just as easily be done on the source side rather than the drain side in a case where the cell is provided in a P well by applying −8.5 volts to the P well for 5 microseconds, 0 volts to the source and control gate with the drain being allowed to float.

Yet another structure and method for programming a cell is detailed in co-pending U.S. patent application Ser. No. 08/871,589, inventors Hao Fang, et al., filed Jul. 24, 1998 and assigned to the assignee of the present application. FIGS. 1A and 1B of the Fang, et al. application are reproduced herein as FIGS. 2A and 2B, and FIGS. 2A and 2B of the Fang application are reproduced as FIGS. 3A and 3B of the present application. The Fang, et al. application uses the programming method disclosed in Haddad, et al. to form a high density, low program/erase voltage and current, and fast byte programming and bulk erase and fast reading speed non-volatile memory structure specifically designed for programmable logic circuit applications.

In Fang, et al. the non-volatile memory cell 10 in FIG. 2A, 2B is formed of a P substrate 12 having embedded therein an N+ source region 14, an N-type diffused drain region 16, a floating gate 18 capacitively coupled to the P substrate 12 through a tunnel oxide 20, or other gate dielectric such as nitride oxide; and a control gate 22 capacitively coupled to the floating gate 18 through an oxide/nitride/oxide, or other type of inter polysilicon dielectric, film 24,26. Diffused region 16 is formed of a shallowly diffused but heavily doped N-type junction, while source region 14 is formed of a deeply diffused but lightly doped N junction. The relatively thin gate dielectric 20 (an oxide of 60 to 150 Å in thickness) is interposed between top surface of substrate 12 and conductor polysilicon floating gate 18. Control gate 22 is supported above the floating gate by the inter-poly dielectric layer 24,26. Avalanche program and erase bias configurations of the memory cell of the Fang, et al. application are shown in FIGS. 3A and 3B, respectively.

Program and erase operations are illustrated in FIGS. 3A and 3B. To program the cell, electron injection is effected from the drain side. In this case, programming operation is accomplished by applying +3 volts on the drain and −6 volts on the P substrate so as to shift upwardly the threshold voltage $V_t$ by 4 volts in approximately 0.002 seconds. To erase, holes are injected from the drain side by applying +6.5 volts on the drain and −3 volts on the P substrate so as to shift down with the voltage threshold $V_t$ by 4 volts. Utilizing the substrate bias configuration suppresses hot hole injection due to the fact that the location of the high field is away from the oxide interface, the magnitude of the maximum field strength is reduced by more than 50%, and the vertical field does not favor hole injection.

FIGS. 4A and 4B show FIGS. 10A and 10B of the Fang, et al. application which teach a single polysilicon layer embodiment of the Fang, et al. cell. In such an embodiment, the control gate is replaced with a diffusion region. The control gate can be switched between 0 volts and $V_{cc}$ to select and de-select the cell during the read period and between $V_{jb}$ and 0 volts to program and erase the cells as set forth above. A select transistor is added at the source side to enable a fast read of the memory cell. In this operation, the gate of the added select transistor is set at less than or equal to zero volts during program and erasing and at $V_{cc}$ with $V_d$ less than or equal to $V_{cc}$ and $V_{dm}$ 0 volts via turning on the memory cell for the read period. ($V_d$ is the drain voltage for the select transistor and $V_{dm}$ is the drain voltage for the memory transistor.) Cell size is decreased in comparison to conventional single poly memory cells for programmable logic devices. The bias configurations for the single poly memory cell are disclosed in FIG. 4B.

Generally, arrays of such individual memory cells are formed on a single substrate and combined with sense and read circuitry, and connected by row-wise and column-wise conductive regions or metallic conductors to allow for array wide bulk program and erase as well as selected bit programming.

In the aforementioned prior art references, each of the devices is provided as an NMOS transistor in a P-doped substrate. The only exception is the Haddad et al reference wherein an NMOS transistor is formed in a p-well which itself is formed in an n-well in a p-type substrate.

Each of the aforementioned configurations presents advantages and disadvantages in use in particular applications. Nevertheless, improvements in both the structure of individual cells and the manner in which they are connected together will result in more reliable, stable, faster, and lower power devices which can be programmed and erased at lower voltages.

Alternative cell constructions, saving space and increasing device efficiency, are generally desired.

SUMMARY OF THE INVENTION

The invention, roughly described, comprises a non-volatile memory cell structure which includes a floating gate, one or more P+N+ junctions that act as reverse breakdown elements for the injection of hot electrons and/or holes, and a sense transistor. The reverse breakdown element is at least partially formed in a first polysilicon layer. The floating gate is provided in a second polysilicon layer which at least partially overlays the reverse breakdown element but is separated from it by an oxide. The sense transistor is at least partially formed in a region of a semiconductor substrate, and it's gate is connected to the floating gate.

In a further embodiment, the structure further comprises a control gate capacitively coupled to the floating gate, where the control gate may be formed in said first polysilicon layer.

In yet another aspect of the invention, the semiconductor substrate has a surface, the first polysilicon layer is provided over the surface of the substrate and the second polysilicon layer is provided over the surface of the first polysilicon layer. Optionally, the reverse breakdown element overlies at least a portion of the device isolation region in the silicon substrate.

Still further, a first dielectric may separate the first polysilicon layer from the surface of the substrate and a second dielectric may separate the first polysilicon layer from the second polysilicon layer.

Optionally, the reverse breakdown electron injection element comprises a first, and second, and, in some embodiments, a third region in polysilicon. The first and second regions comprise a first P/N junction, and the second and third active regions comprising a second P/N junction. The two P/N junctions may be formed differently where one junction is graded to optimize electron injection, while the other is graded to optimize hole injection. In a further aspect, the first, second and third active regions are provided in a first portion of the first polysilicon layer, the floating gate is provided in a second polysilicon layer, and the control gate is provided in a second portion of the first polysilicon layer.

BRIEF DESCRIPTION OF THE DRAWINGS

The invention will be described with respect to the particular embodiments thereof. Other objects, features, and advantages of the invention will become apparent with reference to the specification and drawings in which:

FIG. 1A is a plan view of a Zener breakdown based flash EEPROM cell.

FIGS. 1B and 1C are cross-sections of a prior art reverse breakdown cell, and the Zener breakdown cell shown in FIG. 1A, respectively.

FIG. 2A is a schematic diagram of the non-volatile memory cell of the prior art.

FIG. 2B shows a cross-sectional view of a non-volatile memory cell in accordance with the prior art.

FIGS. 3A and 3B, respectively, show avalanche program and erase bias configurations of a memory cell in accordance with the prior art.

FIG. 4B is a table showing the voltages utilized in accordance with the single poly memory cell shown in FIG. 4A.

DETAILED DESCRIPTION

In one aspect, the invention comprises a novel EEPROM cell structure incorporating avalanche/Zener based reverse breakdown generation of hot electrons and hot holes in an injection element. The cell provides advantages in size, speed, and reliability of an EEPROM array by placing at least one injector element in a polysilicon layer which, in one embodiment, can be formed over a device isolation regions.

In the following description, numerous details, for example specific materials process steps and voltages, etc., are set forth in order to provide a thorough understanding of the invention. It will be readily understood, however, to one of average skill in the art that specific details need not be employed to practice the present invention. Moreover, specific details of particular processes or structures may not be specifically presented in order to not unduly obscure the invention where such details would be readily apparent to one of average skill in the art. Those having ordinary skill in the art and access to the teachings described herein will recognize additional modifications and applications and embodiments within the scope of the present invention.

As discussed herein, non-volatile memory cells are typically utilized with accompanying CMOS circuitry in cell structures. Such circuitry includes means for controlling voltages applied to the respective terminals of the floating gate device, and for reading the state of the device after it is programmed. It will be recognized that the manner in which the cell of the present invention is so coupled may vary in accordance with any number of known schemes, and may include those manners of operation disclosed in co-pending U.S. patent application Ser. No. 09/220,221 filed, entitled FLOATING GATE MEMORY APPARATUS AND METHOD FOR SELECTED PROGRAMMING THEREOF, Inventors Stewart G. Logie, Sunil D. Mehta, and Steven J. Fong incorporated fully herein by reference.

Figure 4A:
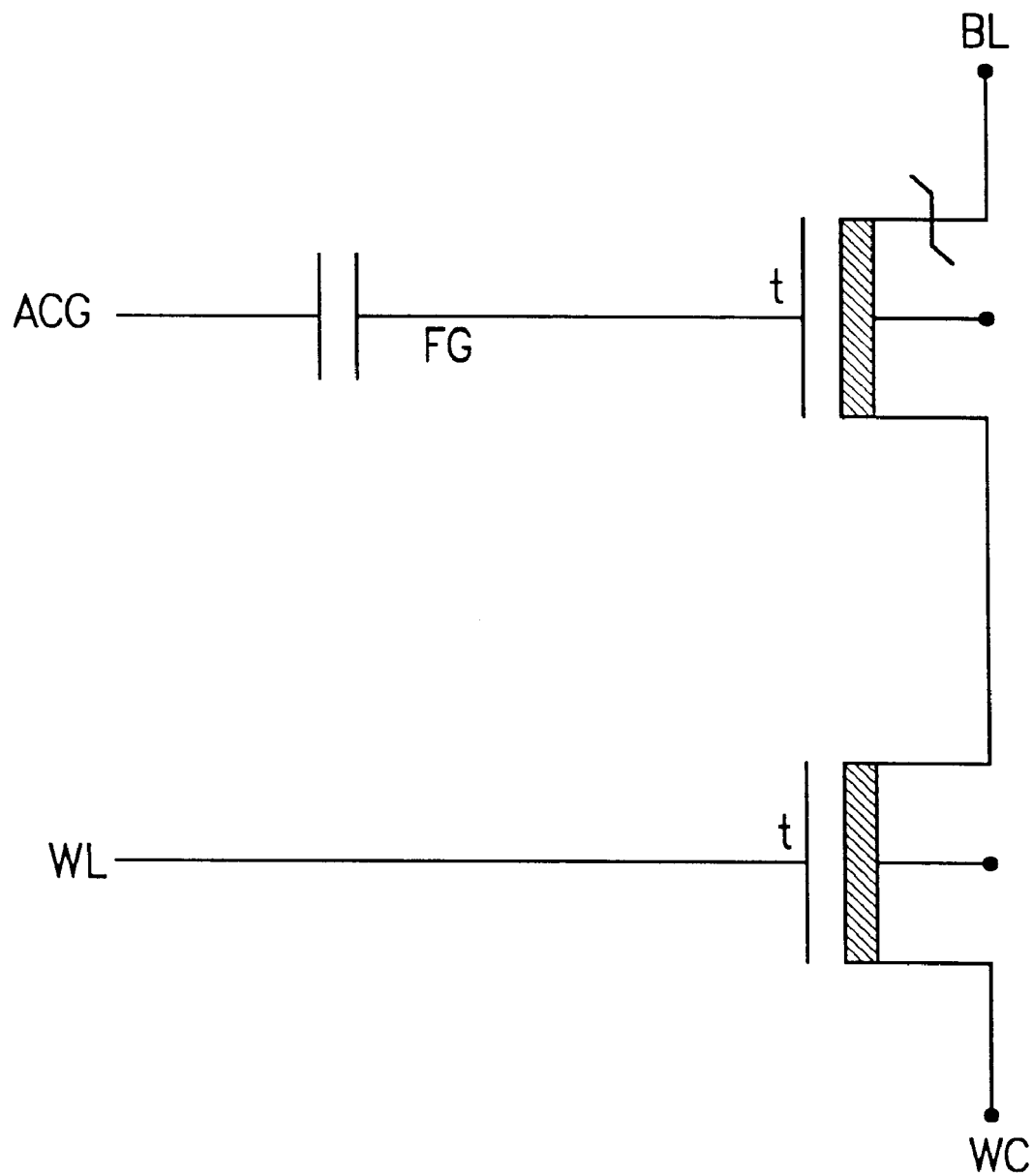
FIG. 4A is a schematic diagram of a single poly memory cell in accordance with the prior art.
Figure 5:
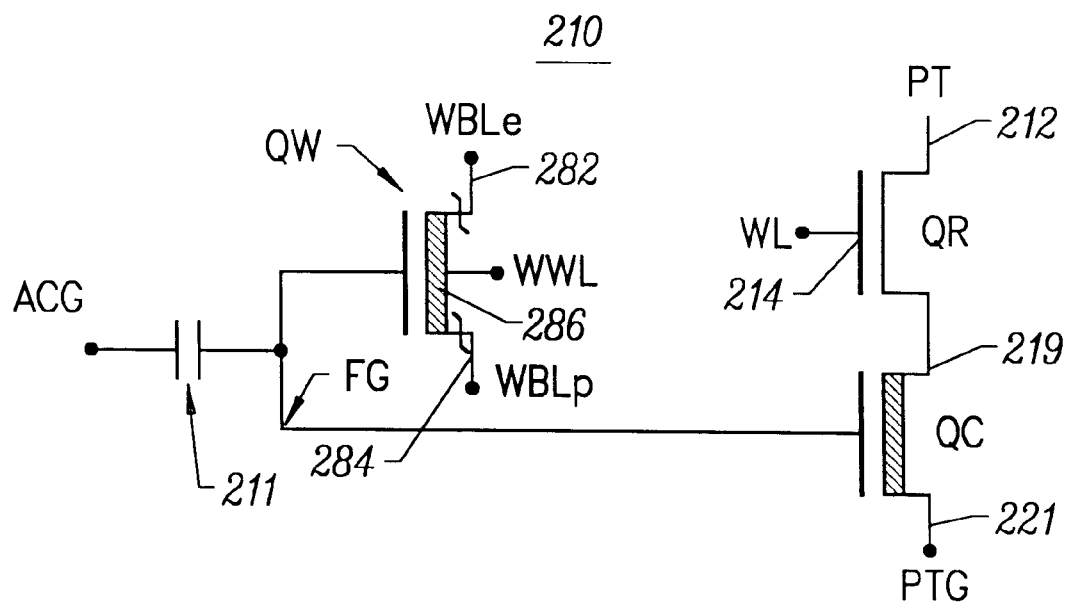
FIG. 5 is a schematic diagram of a memory cell formed in accordance with the invention.

FIG. 5 shows a schematic diagram of a first embodiment of a nonvolatile memory cell structure 210 formed in accordance with one aspect of the present invention.

Cell 210 includes an (array) control gate ACG, floating gate FG, avalanche/Zener program element $Q_w$, a read transistor $Q_r$, and a sense transistor $Q_c$. The control gate ACG is used to accelerate electrons or holes selectively to or from the floating gate by capacitively coupling a field across the oxide that separates the avalanche element from the floating gate. Sense transistor $Q_c$ and avalanche element $Q_w$ share floating gate FG. Floating gate FG is capacitively coupled to array control gate (ACG) voltage via capacitor/oxide 211.

Sense transistor $Q_c$ shares its drain 219 with the source of read transistor $Q_r$. Gate 214 of read transistor $Q_r$ is connected to word line WL. The drain 212 of read transistor $Q_r$ is connected to a read signal select (product term) PT, while the source 221 of sense transistor $Q_c$ is connected to sense signal (product term gate) PTG.

Figure 6:
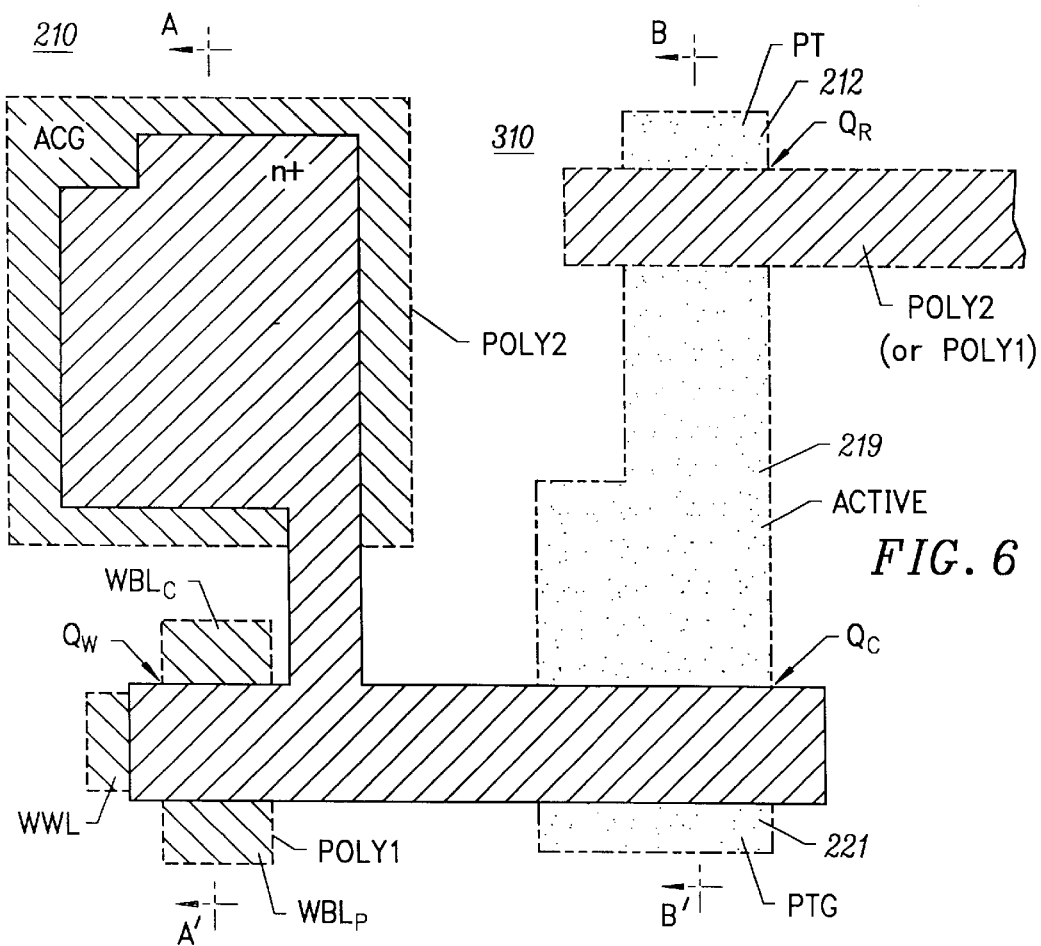
FIG. 6 plan view of a semiconductor substrate in accordance with the present invention.
Figure 7:
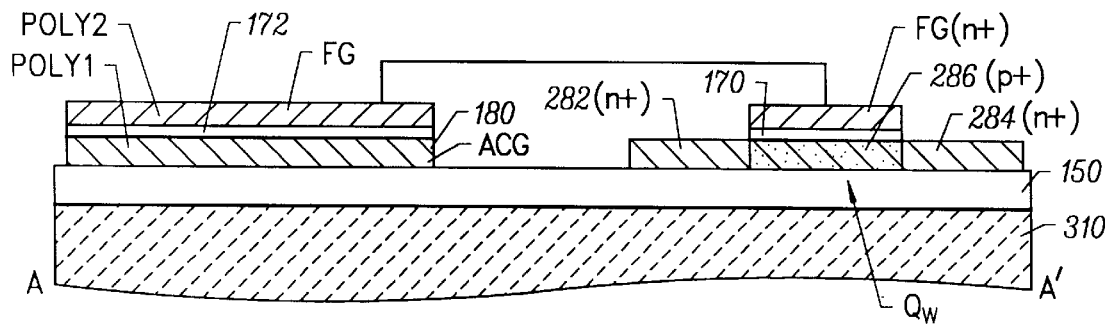
FIGS. 7 and 8 are cross-sections of a semiconductor substrate of FIG. 6.
Figure 8:
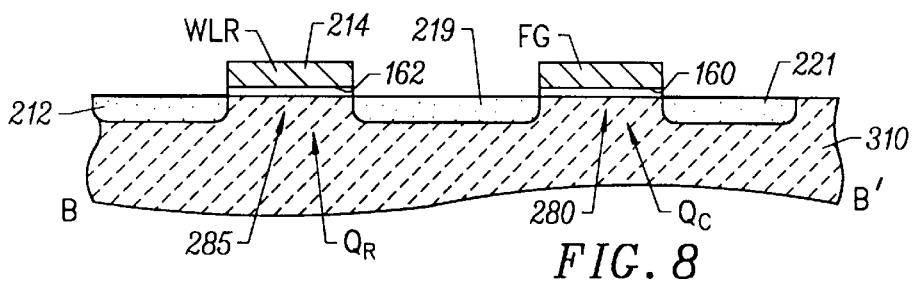

FIG. 6 is a plan view, and FIGS. 7 and 8 are cross-sections along lines A–A', and B–B' in FIG. 6, of a first embodiment of the EEPROM cell structure of FIG. 5. The cell of the present invention is constructed on and in a silicon substrate 310, which has a background doping concentration of a first conductivity type, such as a P-type conductivity. In accordance with one aspect of the invention, a control gate ACG is formed in a first region 120 of a first polysilicon layer POLY 1, while the program element $Q_w$ is formed in a second region 125 of POLY 1. The floating gate FG is formed in a second layer of polysilicon POLY 2 which overlies portions of two regions of the POLY 1 layer. Program element $Q_w$ is electrically separated from the substrate 310 by a dielectric 150, e.g. silicon dioxide having a thickness of 1,000–8,000 Å, also formed on substrate 310 by any number of conventional device isolation techniques (e.g. LOCOS or shallow trench isolation). Control gate ACG is also separated from substrate 310 by dielectric 150. First polysilicon layer POLY 1 is separated from the portion of second poly layer POLY 2 overlying it by dielectric 170 or 172 such as, for example, silicon dioxide.

Sense transistor $Q_c$ has a source 221 and a drain 219 formed in the semiconductor substrate 310. A sense channel 280 is formed between source 221 and drain 219. The conductivity of the source 221 and the drain 219 is of the second conductivity type, for example, an N+ conductivity type. Overlying the channel 280 is oxide layer 160 having an approximate thickness of 80 angstroms.

Floating gate FG (formed by POLY 2) overlies channel 280 on oxide 160. Oxide layer 160 may be formed by thermal oxidation of silicon in accordance with well-known techniques and its formation may comprise a portion of a multiple step oxide growth process used to also form oxides 170, 172 and 162, or all such oxides may be formed in separate growth/deposition steps. Depending on the mode of sense transistor Q, (depletion or enhancement mode), the relevant voltages for operating the EEPROM cell 210 are adjusted. The sense transistor $Q_c$ is, in one embodiment, a depletion mode transistor, as is commonly understood in the industry and is used as an example for the voltages herein. In a further embodiment, the sense transistor $Q_c$ is an enhancement mode transistor (also as commonly known in the industry).

The read transistor $Q_r$ shares diffusion region 219 with the sense transistor $Q_c$. Hence region 219 acts as the read transistor source. The read transistor $Q_r$ also has a drain 212 that has the second conductivity type, e.g. an N+ conductivity type. A channel 285 is positioned between source 219 and drain 215. Overlying the read channel is an oxide layer 162 that is composed of an insulating material, such as silicon-dioxide, and has an approximate thickness of 25–80 angstroms. Read oxide 162 may be formed simultaneously with oxide 160 as set forth above, or may be formed separately therefrom with appropriate masking and growth steps. A read gate 214 overlies the read tunnel oxide layer 162 and is composed of a conducting material, such as a polycrystalline silicon material.

In one aspect of the invention, program element $Q_w$ and array control gate ACG are formed in the same polysilicon layer POLY 1. Floating gate FG and control gate 214 are formed in POLY 2. Alternatively, WLR control gate 214 may be formed in the POLY 1 layer rather than the POLY 2 layer. Layer POLY 1 is commonly referred to in the industry as a "poly 1" layer since it is the first-in time polysilicon layer deposited on substrate 310. The POLY 1 layer is deposited on the surface of device isolation or dielectric 150 (and, in one embodiment, additionally deposited on oxide 162), through any number of conventional deposition and/or sputtering techniques including, by way of example, chemical vapor deposition (CVD) including any number of variants of CVD such as low pressure CVD.

In a further aspect of the invention, the program element $Q_w$, and the array control gate ACG, may overlie a device isolation region which is formed in semiconductor substrate 310 by any number of well-known techniques such as, for example, local oxidation of the silicon (LOCOS), shallow trench isolation, or the like. It should be recognized that the particular type of device isolation utilized is not limiting on the scope or nature of the present invention, and various types of such device isolation may be utilized without departing from the scope of the invention discussed herein.

As shown in FIG. 7, avalanche/zener element $Q_w$ comprises an N+ region 282, a P+ region 286 and a second N+ region 284, all formed in first poly layer POLY 1. Element $Q_w$ may be formed by one or more P/N junction regions. POLY 1 may be deposited with an initial P-type bias and then counter doped with an N-type impurity in appropriate portions of POLY 1 (e.g. regions 282,284) to form the P/N junctions. POLY 1 may also be deposited with an initial N doping and P+ counter doped. In either case, the doping of regions 282,284 occurs after formation of-floating gate FG so regions 282,284 are self-aligned.

Formation of transistors $Q_c$ and $Q_r$ can be performed in accordance with well-known implanting techniques for regions 212, 219 and 221, which can be N+ regions having a surface doping concentration of approximately $10^{20}$ cm$^{-3}$. Notably, formation of the control gate 214 and floating gate FG overlying channels 285 and 280, respectively, allows self-alignment of doping regions 212,219,221, while floating gate FG, overlying region 286 results in doping of regions 282 and 284. Implant techniques can also be used to enhance the P-doping (in this example) of the extension of region 286 or the extension of region 180 in the case where region 180 is P-doped. It should be noted that the doping of regions 212, 219 and 221 of $Q_r$, and therefore the doping level of POLY 2, is only of minor importance in determining the breakdown requirements of element $Q_w$.

The transistors $Q_w$, $Q_c$ and $Q_r$ of EEPROM 210 are electrically connected to certain electrical lines and gates in order to operate and control the functions of the EEPROM cell 210. As shown in FIG. 5, $WBL_e$ is electrically connected to region 282, $WBL_p$ connected to region 284, and WWL to P+ region 286. An array control gate (ACG) is electrically connected to the floating gate FG. A product term gate (PTG) is electrically connected to the sense source 221 of the sense transistor $Q_c$. A word line read (WL) is electrically connected to the read gate 214 of the read transistor $Q_r$ and a product term (PT) is electrically connected to the read drain 212.

Typical operating voltages for the foregoing lines to erase, program and read the cell are given in Table 1 for the case of an N++/P write element (i.e., inject electrons onto the floating gate FG during erase, and inject holes onto the floating gate FG during program):

TABLE 1

|  | $WBL_c$ | $WBL_p$ | ACG | WWL | WL | PT | PTG |
|---|---|---|---|---|---|---|---|
| Program | 0v | 6v | 0v | 0 | 0v | Float | 0v |
| Erase | 6v | 0v | 8v | 0 | $V_{cc}$ | Float | 8v |
| Read | 0v | 0v | 0v | 0 | $V_{cc}$ | $V_{cc}$ | 0v |

According to the present invention, hot carriers generated by Avalanche/Zener breakdown are employed to program and erase memory cell 210. The P$^+$N$^+$ junction formed by regions 284,285 is reverse biased as set forth in Table 1 when the voltage difference between WBL and WWL exceeds the breakdown voltage. Both hot electrons and hot holes are generated during breakdown. Hot electrons are accelerated toward the floating gate FG when the potential in the floating gate FG capacitively coupled from the ACG becomes greater than that of region 206. At a large enough field across oxide layer 170 hot electrons generated at the junction in breakdown are "injected" into floating gate 140 through oxide layer 170 and the resulting net negative voltage on floating gate FG erases memory cell 210.

Reverse biasing the P$^+$N$^+$ junction formed by P$^+$ region 285 and either N$^+$ region 282 or 284 allows programming when a low or zero voltage on ACG with P$^+$N$^+$ junction 282/285 or 284/285 in Avalanche/Zener breakdown mode injects hot holes through a portion of oxide layer 180. The resulting net positive voltage on floating gate FG programs memory cell 210.

The cell of the present invention hence promotes a number of advantages over the prior art that lead to a reduced size. The array control gate (ACG) can be formed over device isolation. The Avalanche/Zener element is self aligned to the floating gate and can therefore be a minimum feature.

In addition, precise control of the reverse breakdown potential of the write element is possible through the present invention. The self aligned P$^+$/N$^+$ junction provides repeatable control of the junction location. Further, doping of the lighter doped side (POLY 1) of the avalanche/Zener element is independent of the doping requirements of the transistor.

Still further, reliability of the device of the present invention is improved. The doping of the polysilicon layer POLY 1 is independently controlled, allowing optimization of oxide growth. Program and erase functions can be performed through different portions of oxide 180, leading to a reduction in the potential for formation of carrier traps and allowing independent optimization of each of the P+N+ avalanche/Zener elements $WBL_c$ and $WBL_p$.

The many features and advantages of the present invention will be apparent to one of average skill in the art in view of the illustrative embodiments set forth herein. The present invention has been described herein with respect to particular embodiments for a particular applications. It will be apparent to one of average skill in the art that numerous modifications and adaptations of the present invention may be made in accordance with the invention without departing from the spirit of the scope of the invention as disclosed herein and defined by the following claims.

What is claimed is:

1. A non-volatile memory cell structure, comprising:
    a reverse breakdown element at least partially formed in a first polysilicon layer;
    a floating gate provided in a second polysilicon layer and capacitively coupled to the reverse breakdown element; and
    a sense transistor at least partially formed in a region of a semiconductor substrate, and connected to the floating gate;
    wherein the semiconductor substrate has a surface, the first polysilicon layer is provided over the surface of the substrate and the second polysilicon layer is at least partially provided over the surface of the first polysilicon layer.

2. The structure as defined in claim 1 further comprising:
    a control gate capacitively coupled to the floating gate.

3. The structure as defined in claim 2 wherein the reverse breakdown element comprises a first and second, active regions, the first and second regions comprising a first P/N junction.

4. The structure as defined in claim 2 wherein the reverse breakdown element induces a third active region, the second and third active regions comprising a second P/N junction.

5. The structure as defined in claim 4 wherein the first second and third active regions are provided in a first portion of the first polysilicon layer, the floating gate is provided in a first portion of a second polysilicon layer, and the control gate is provided in a second portion of the first polysilicon layer.

6. The structure as defined in claim 5 wherein the second polysilicon layer overlies at least the first and second portions of the first silicon layer.

7. The structure as defined in claim 5 wherein the sense transistor includes a fourth and fifth active regions formed in said substrate and separated by a channel region, wherein at least a portion of the floating gate overlies the channel region.

8. The structure as defined in claim 7 further including a read transistor having a sixth active region and sharing said fifth active region with said sense transistor.

9. The structure as defined in claim 7 further including a gate oxide of about 25 to 160 Å.

10. The structure of claim 9, further comprising
a read transistor having a second drain region and sharing said first source region, a second portion of said second oxide, and a control gate overlying the second portion of the third insulator.

11. The structure as defined in claim 9 wherein the first insulator is an oxide with a thickness of about 1000 to 8000 Å.

12. The structure as defined in claim 9 wherein the second insulator is an oxide having a thickness of about 60 to 180 Å.

13. The structure as defined in claim 9 wherein the third insulator is an oxide having a thickness of about 25–80 Å.

14. The structure as defined in claim 9 wherein the first portion of the substrate comprises a device isolation region.

15. The structure as defined in claim 9 wherein the second portion of the substrate comprises a device isolation region.

16. The structure as defined in claim 2 wherein the control gate is formed in said first polysilicon layer.

17. The structure as defined in claim 1 wherein the reverse breakdown element overlies at least a portion of the device isolation region in the silicon substrate.

18. The structure as defined in claim 1 wherein a first insulator separates the first polysilicon layer from the surface of the substrate and a second insulator separates the first polysilicon layer from the second polysilicon layer.

19. The structure as defined in claim 6 wherein the first insulator has a thickness of about 1000 to 8000 Å.

20. The structure as defined in claim 18 wherein the second insulator has a thickness of about 60 to 180 Å.

21. A non-volatile memory cell structure, comprising:
a semiconductor substrate having a surface and a doping concentration of a first conductivity type;
a first insulator layer on the surface of the substrate;
a control gate formed in a first portion of a first polysilicon layer on a first portion of the first insulator over a first portion of the substrate;
a reverse breakdown element formed in a second portion of the first polysilicon layer over a second portion of the substrate;
a floating gate constructed in a second polysilicon layer separated from the first polysilicon layer by a second insulator and overlying at least portions of said control gate and reverse breakdown element; and
a sense transistor including a first source region, and a first drain region both formed in the substrate, and a portion of the floating gate separated from the first source region and the first drain region by a third insulator layer.

22. An EEPROM structure, comprising:
a semiconductor substrate of a first conductivity type having a surface;
a sense transistor including a first source and drain regions formed in the substrate adjacent to the surface of said substrate;
an injection element in a first region of a first polysilicon layer adjacent to the substrate surface and separated from said surface by a gate oxide layer;
a control gate in a second region of the first polysilicon layer;
a floating gate formed in a second polysilicon layer having portions overlying the control gate, the sense transistor, and the injection element;
wherein the injection element is constructed so that a reverse voltage breakdown condition generated at the drain region adds or removes electrons from the floating gate when an appropriate voltage is applied to the gate.

23. The structure of claim 22 wherein the control gate is connected to a control gate voltage.

24. The structure of claim 22 wherein the injection element overlies a device isolation region in the substrate.

25. The structure of claim 22 wherein the control gate overlies a device isolation region in the substrate.

26. The structure of claim 22 wherein the injection element includes at least a first and a second active regions forming a first PN junction, and the first active region is connected to a write control voltage and the second active region is connected to a device control voltage, and the control gate is connected to a gate control voltage.

27. The structure of claim 26 wherein the injection element includes a third active region forming a PN junction with the second active region and the third active region is connected to an erase control voltage.

28. The structure of claim 26 wherein the write control voltage is 6 volts, the device control voltage is 0 volts, and the gate control voltage is 8 volts to add electrons to the floating gate.

29. The structure of claim 26 wherein the write control voltage is 6 volts, the device control voltage is 0 volts, and the gate control voltage is less than one volt to remove electrons from the floating gate.

* * * * *